(12) United States Patent
Widmer et al.

(10) Patent No.: US 6,169,569 B1
(45) Date of Patent: Jan. 2, 2001

(54) CABLE MODEM TUNER

(75) Inventors: Thomas Widmer, Southlake, TX (US); Manfred Reiss, Ingolstadt (DE)

(73) Assignee: Temic Telefumken, Grossmehring (DE)

( * ) Notice: Under 35 U.S.C. 154(b), the term of this patent shall be extended for 0 days.

(21) Appl. No.: 09/103,495

(22) Filed: Jun. 24, 1998

Related U.S. Application Data

(60) Provisional application No. 60/086,395, filed on May 22, 1998.

(51) Int. Cl.$^7$ .............................. H04N 7/10; H04N 7/14; H04B 1/18; H04B 1/16; H04B 1/10
(52) U.S. Cl. ............................. 348/11; 348/12; 348/13; 348/731; 455/311; 455/318; 455/177.1; 455/200.1
(58) Field of Search ..................... 348/6, 11–13, 348/731; 455/302, 310, 311, 313, 317, 318, 177.1, 200.1, 197.1, 249.1; 370/395, 397; 709/252

(56) References Cited

U.S. PATENT DOCUMENTS

| | | |
|---|---|---|
| 4,271,529 | 6/1981 | Strammello, Jr. . |
| 4,562,472 | 12/1985 | Carlson . |
| 4,750,036 | 6/1988 | Martinez . |
| 5,126,840 * | 6/1992 | Dufresne et al. .......................... 348/6 |
| 5,255,086 | 10/1993 | McMullan, Jr. et al. . |
| 5,317,392 * | 5/1994 | Ishibashi et al. .......................... 348/6 |
| 5,329,370 | 7/1994 | Yazolino et al. . |
| 5,355,162 | 10/1994 | Yazoline et al. . |
| 5,385,400 * | 1/1995 | Malchow ............................ 455/239.1 |
| 5,421,030 * | 5/1995 | Baran ...................................... 455/5.1 |
| 5,425,027 * | 6/1995 | Baran .................................... 370/395 |
| 5,437,051 * | 7/1995 | Oto .......................................... 455/3.2 |
| 5,485,221 | 1/1996 | Banker et al. . |
| 5,539,822 | 7/1996 | Lett . |
| 5,544,164 * | 8/1996 | Baran .................................... 370/397 |
| 5,550,820 * | 8/1996 | Baran .................................... 370/395 |
| 5,553,838 * | 9/1996 | Suizu ..................................... 348/735 |
| 5,557,319 * | 9/1996 | Gurusami ................................. 348/6 |
| 5,654,774 | 8/1997 | Pugel et al. . |
| 5,745,838 | 4/1998 | Tresness et al. . |
| 5,752,179 | 5/1998 | Dobrovolny . |
| 5,761,602 | 6/1998 | Wagner et al. . |
| 5,768,280 | 6/1998 | Way . |
| 5,790,806 * | 8/1998 | Koperda ................................. 709/252 |
| 5,812,928 | 9/1998 | Watson, Jr. et al. . |
| 5,822,324 | 10/1998 | Kostresti et al. . |
| 5,838,268 | 11/1998 | Frenkel . |
| 5,898,900 | 4/1999 | Richter et al. . |
| 5,926,479 * | 7/1999 | Baran .................................... 370/395 |
| 5,930,696 | 7/1999 | Tzuang et al. . |
| 6,011,597 * | 1/2000 | Kubo ..................................... 348/11 |

\* cited by examiner

*Primary Examiner*—Andrew I. Faile
*Assistant Examiner*—Hai V. Tran
(74) *Attorney, Agent, or Firm*—Haynes and Boone, LLP

(57) ABSTRACT

A cable modem is configured to include a tuner having a front end which includes a duplex filter stage and a decoupler stage and a rear end which includes a single conversion tuner. The duplex filter stage couples the tuner to a network, a computer system and the front end decoupler stage. Signals received from the network are directed by the front end duplex filter stage to the front end decoupler stage while signals received from the computer system are directed by the front end duplex filter stage to the network. The front end decoupler stage passes RF signals received at an input thereof to an input of the single conversion tuner coupled to an output of the front end decoupler circuit. The single conversion tuner selects, from the plurality of RF signals received thereby, an RF signal to be converted into an IF signal for output therefrom while rejecting the remainder of the plurality of RF signals. The front end decoupler stage also acts to isolate the single conversion tuner from the input thereof, thereby preventing the rejected ones of the plurality of RF signals, as well as return signals originating within the single conversion tuner stage, from passing back through the front end decoupler stage.

24 Claims, 2 Drawing Sheets

CABLE MODEM TUNER

CROSS-REFERENCE TO RELATED PROVISIONAL APPLICATION

This application claims the benefit of U.S. Provisional Patent Application Ser. No. 60/086,395, filed on May 22, 1998.

TECHNICAL FIELD

The invention relates generally to cable modems and, more particularly, to a cable modem tuner which includes a front end decoupler stage which enables the tuner to employ a single conversion architecture within a cable modem coupled to a CATV network.

BACKGROUND OF THE INVENTION

A tuner is a device which amplifies a radio frequency (or "RF") signal received by an antenna or via cable and converts the received RF signal into a fixed intermediate frequency (or "IF") signal. Tuners are used in a variety of applications. For example, television sets are often equipped with tuners for selecting specific broadcast channels from VHF (54 to 88 and 174 to 216 MHz) and UHF (470 to 860 MHz) frequency bands. Similarly, cable boxes are equipped with a tuner to select between as many as 121 cable channels which are received in a single frequency band which extends between 54 and 860 MHz.

Two types of tuners presently in use are respectively known as "single conversion" and "double conversion" tuners. In a single conversion tuner, an RF signal for a selected channel is converted into an IF signal. Double conversion tuners, on the other hand, convert the RF signal for a selected channel into a first intermediate signal and then convert the first intermediate signal into the IF signal. While more expensive than the single conversion tuner, the ability of the double conversion tuner to handle larger amounts of signal and to prevent return signals from passing back onto the cable has resulted in the widespread use of double conversion tuners in cable boxes.

In recent years, it has been proposed that the infrastructure of the CATV network may be used to provide PC users with access to the internet and other high speed data networks. A cable modem is a device which allows high speed data accesses to the internet via the CATV network at speeds 1,000 times faster than that of a telephone modem. Other services which may be available via a cable modem include access to CD-ROM and streaming video servers. It is expected that the implementation of a high-speed data network to the home will require the establishment of various standards for home systems which will be used to access the network. One such standard which is already in use is known as the multimedia cable network standard (or "MCNS"). In order to comply with the MCNS limitation on the return signals passing back onto the cable, existing cable modem tuners employ a double conversion architecture. If, however, it were possible to construct a cable modem tuner which complied with MCNS standards while employing a single conversion architecture, considerable cost savings could be achieved. It is, therefore, the object of this invention to provide such a cable modem tuner.

SUMMARY OF THE INVENTION

In various embodiments thereof, the present invention is of a tuner for a cable modem and a cable modem which incorporates the tuner. The tuner includes a front end decoupler stage and a single conversion tuner. The front end decoupler stage passes RF signals received at an input thereof to an input of the single conversion tuner coupled to an output of the front end decoupler circuit. The single conversion tuner selects, from the plurality of RF signals received thereby, an RF signal to be converted into an IF signal for output therefrom while rejecting the remainder of the plurality of RF signals. The front end decoupler stage also acts to isolate the single conversion tuner from the input thereof, thereby preventing the rejected ones of the plurality of RF signals, as well as return signals originating within the single conversion turner, from passing back through the front end decoupler stage.

In one aspect of this embodiment of the invention, the front end decoupler stage prevents the rejected ones of the plurality of RF signals and the return signals originated by the single conversion turner from being transmitted to devices which reside on a cable coupled to the input of the front end decoupler stage. In another aspect thereof, the plurality of RF signals are contained in a band which extends from about 54 MHz to about 860 MHz.

In still another aspect thereof, the tuner includes a front end duplex filter stage for coupling the tuner to a network, a computer system and the front end decoupler stage. Signals received from the network are directed by the front end duplex filter stage to the front end decoupler stage while signals received from the computer system are directed by the front end duplex filter stage to the network. Alternately, the tuner may instead include a first, input/output ("I/O"), port, a second, input, port and a third, output, port. RF signals from a CATV cable pass to the front end decoupler stage via a downstream signal path which extends from the CATV cable, through the I/O port, the output port and on to the input of the front end decoupler stage while signals generated by a computer pass to the network via an upstream signal path which extends from the computer system, through the input port, the I/O port and on to the CATV cable.

In a still further aspect of this alternate configuration, the tuner also includes a first filter positioned between a node which joins the upstream and downstream paths and the input to the front end decoupler circuit and a second filter positioned between the node and the input port. The first filter prevents signals generated by the computer system from passing to the front end decoupler circuit while the second filter prevents RF signals received from the CATV cable from passing to the input port. Preferably, the first filter may be a high bandpass filter having a pass band which extends from about 54 MHz to about 860 MHz while the second filter is a low bandpass filter having a pass band which extends from about 5 MHz to about 42 MHz.

In still other aspects thereof, the front end decoupler circuit may include either a broadband filter for passing the plurality of RF signals, each at a discrete frequency within a frequency range or the broadband filter in combination with an automatic gain control ("AGC") circuit.

DETAILED DESCRIPTION OF THE PREFERRED EMBODIMENT

Figure 1:
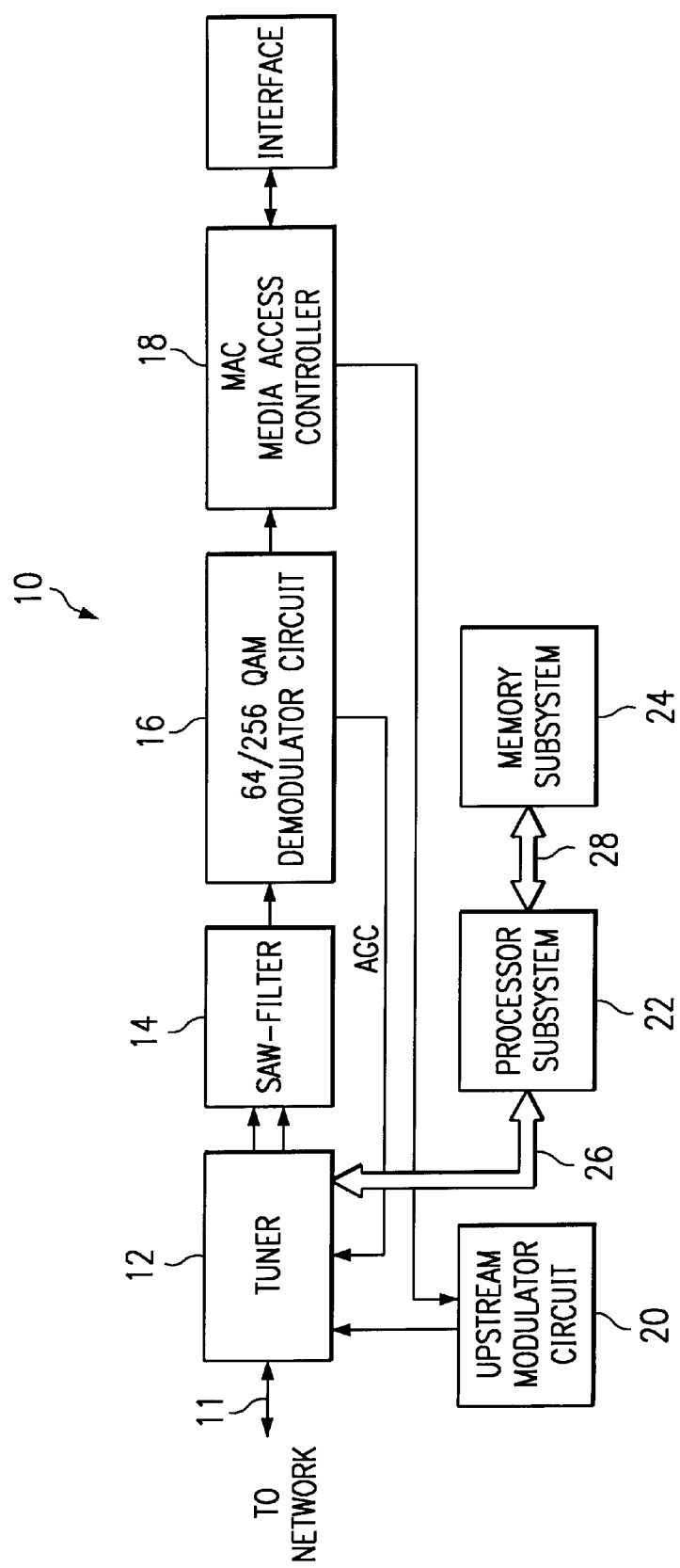
FIG. 1 is a block diagram of a cable modem which incorporates a tuner constructed in accordance with the teachings of the present invention.

Referring now to FIG. 1, a cable modem 10 which includes a tuner 12 constructed in accordance with the teachings of the present invention will now be described in greater detail. The cable modem 10 is coupled to a network (not shown) by a cable 11, typically, a coaxial cable, which is connected to an input/output ("I/O") port (not shown in FIG. 1) of the tuner 12. For example, the I/O port may be a conventional F-type RF connector adapted to receive a feed within the CATV frequency band which extends from 54 MHz to 860 MHz. In addition to a traditional CATV system site which generates a CATV signal onto the cable 11 for distribution to plural destinations, one of which is the tuner 12, it is contemplated that various other systems for receiving or transmitting video, audio and/or other types of data signals, may also reside on the network.

The tuner 12 is bi-directional in that an incoming signal received from the network via the cable 11 is directed downstream to the computer system while an incoming signal received from the computer system is directed upstream to the network. In operation, an input signal to the cable modem 10, for example, an RF signal, preferably a CATV signal which extends from 54 MHz to 860 MHz, generated by a device residing on the network, is received by the tuner 12. The tuner 12 converts the RF signal to first and second IF signals (IF1 and IF2) at 43.75 MHz and outputs the first and second IF signals to a saw filter 14 where the signal is filtered and limited to a 6 MHz bandwidth. The resultant signal is passed to a demodulator 16, where an analog-to-digital (or "A/D") conversion of the signal, followed by a QAM 64/256 demodulation, viterbi decoding and forward error correction of the input signal is performed. The digital signal produced thereby is then transmitted to a media access controller (or "MAC") 18 which controls the protocol and administration layer of the cable modem 10.

The MAC 18, which may be implemented in either hardware or a combination of hardware and software, assigns frequencies and data rates for upstream transmissions and allocates time slots for upstream transmission. From the MAC 18, data continues on to an interface 19 for a computer system (not shown). For example, the interface 19 may be a peripheral connection interface (or "PCI") bus of the computer system. Preferably, the PCI bus should include a slot in which the cable modem tuner 10, implemented on a card, is inserted. Unlike most cards, however, the cable modem 10 should be enclosed in a shielded unit to prevent the computer system from interfering with proper operation of the tuner 12.

In addition to being part of the downstream path from the CATV signal source to the computer system, the MAC 18 is also in the upstream path which originates at the computer system and extends to the network. Digital data originating at the computer system, for example, at the processor or memory subsystems thereof, is placed on the PCI bus or other interface 19 for transfer to the MAC 18. From the MAC 18, the digital data is passed on to the modulator 20. There, the digital data is modulated onto a selected frequency and converted into an analog signal. From the modulator 20, the signal is transmitted to the tuner 12 where it enters at a first input port of a front end duplex filter stage 32 which, as will be more fully described below, directs the analog signal out an input/output (or "I/O") port and onto the cable 11 for transmission to a specified device residing on the network.

Finally, the cable modem 10 also includes a processor subsystem 22, for example, a microcontroller, and memory subsystem 24. The processor subsystem 22 is coupled to the tuner 12 by an IIC bus 26 while the memory subsystem 24 is coupled to the processor subsystem 22 by a local bus 28. Via the IIC bus 26, the processor subsystem 22 controls band selection and tuning for the tuner 12, for example, using information residing in the memory subsystem 24.

Figure 2:
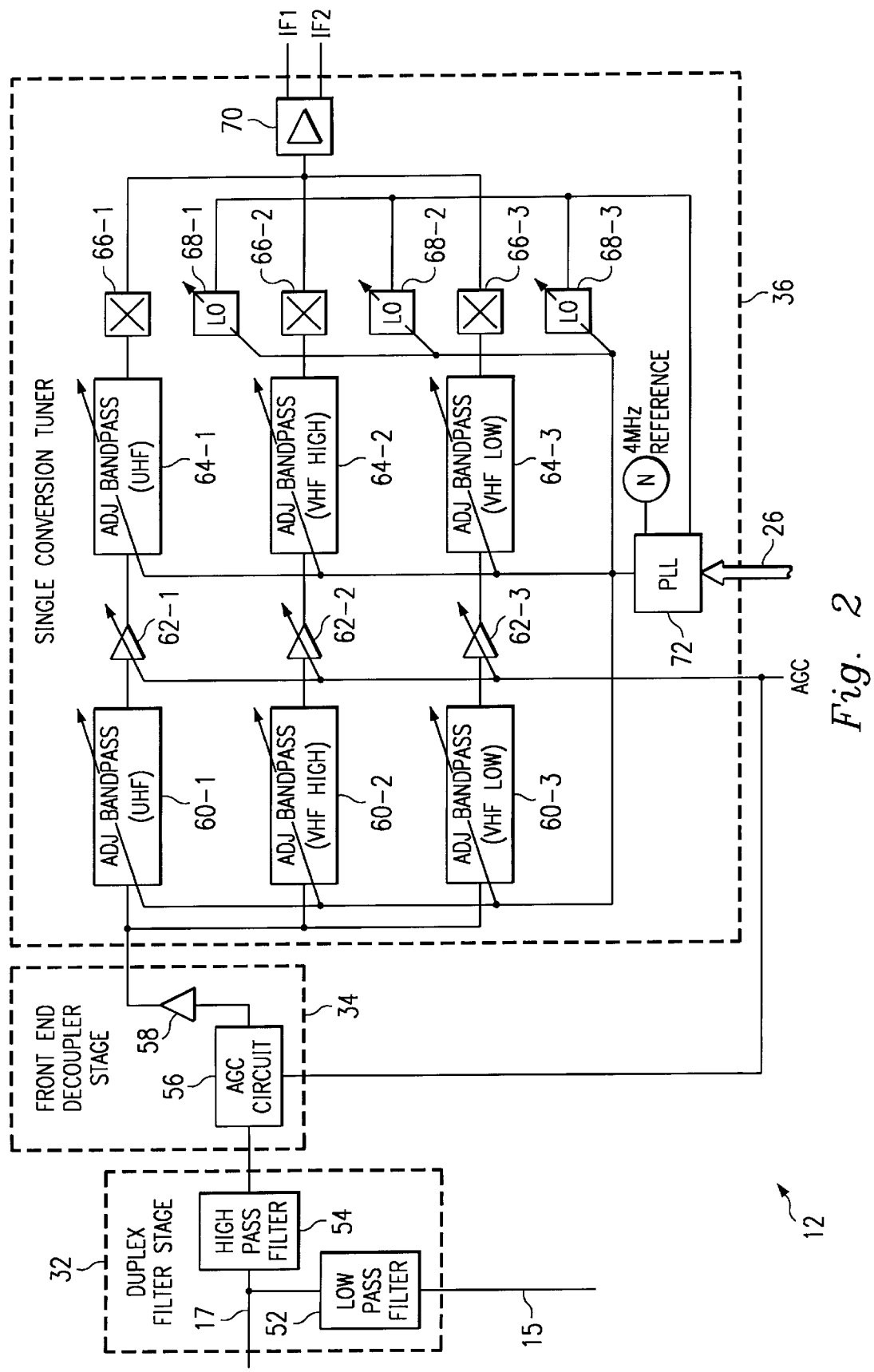
FIG. 2 is a block diagram of the tuner of FIG. 1.

Referring next to FIG. 2, the tuner 12 will now be described in greater detail. As will be more fully described below, the tuner 12 is comprised of a front end comprised of the front end duplex filter stage 32 and a front end decoupler stage 34 and a back end comprised of a single conversion tuner stage 36. The front end duplex filter stage 32 has a first, input/output (or "I/O"), line coupled to the cable 11 by an I/O port 13, a second, input, line coupled to the upstream modulator 20 of the cable modem 10 by an input port 15 and a third, output, line coupled to the front end decoupler stage 34 of the tuner 12. The front end duplex filter stage 32 enables the tuner 12 to handle bi-directional transmissions. Specifically, the front end duplex filter stage 32 is configured such that an incoming CATV signal originating on the network will propagate along the downstream path to the output line of the front end duplex filter stage 32. The CATV signal will, however, be blocked from propagating along the upstream path along the second input line. Conversely, a signal originating at the computer will propagate along the upstream path and onto the cable 11 while being blocked from traveling along the downstream path to the output line of the front end duplex filter stage 32.

The front end decoupler stage 34 has an input line coupled to the output line of the front end duplex filter stage 32 and an output line coupled to the single conversion tuner stage 36. In turn, the single conversion tuner stage 36 has an input line coupled to the output line of the front end decoupler stage 34 and first and second output lines IF1 and IF2 coupled to the saw filter 14 of the cable modem 10. From multiple CATV signals, each at a discrete frequency within the 54 to 880 MHz frequency band, entering the single conversion tuner, the CATV signal operating at a selected frequency is converted into an IF signal and passed to the saw filter 14 while the CATV signals at the remaining frequencies are rejected.

The front end decoupler stage 34 decouples the front end of the tuner 12, i.e., the front end duplex filter stage 32 and the front end decoupler stage 34, from the back end of the tuner 12, i.e., the single conversion tuner stage 36, coupled to the output line of the front end decoupler stage 34. As a result, an incoming CATV signal comprised of a plurality of RF signals passes through the front end decoupler stage 34 and enters the single conversion tuner stage 36 where a selected RF signal is converted into the IF signal while the remaining ones of the plurality of RF signals are rejected but the rejected ones of the plurality of RF signals, as well as return signals produced by the single conversion tuner stage 36, are blocked from passing back through the front end decoupler stage 34. Without the front end decoupler stage 34, both the rejected ones of the plurality of RF signals and the return signals produced by the single conversion tuner stage 36 would pass through the front end duplex filter stage 32 and back onto the cable 11 where, since the cable 11 is coupled typically coupled to multiple tuners, the return signal would create interference with the CATV signal being received by other tuners.

The configuration of each of the front end duplex filter stage 32, the front end decoupler stage 34 and the single conversion tuner stage 36 will now be described in greater detail. As previously mentioned, the front end duplex filter stage 32 has an I/O port coupled to the cable 11, an input port 15 coupled to the upstream modulator 20 of the cable modem 10 and an output coupled to an input of the front end decoupler stage 34. The front end duplex filter stage 32 further includes a node 17 coupled to the I/O port 13, a low bandpass filter 52 positioned between the node 17 and the input port 15 and a high bandpass filter 54 positioned between the node 17 and the output line. The cable modem 10 is bi-directional in that the front end duplex filter stage 32 of the tuner 12 enables both the transmission of signals from a signal source on the network to the PC and from the PC to the network. Specifically, the frequency band for the input signal received from a signal source on the network is the CATV frequency band—54 MHz to 860 MHz. The low bandpass filter 52 is selected such that only signals below the CATV frequency band can pass. For example, the low bandpass filter 52 may have a pass band having a lower limit at 5 MHz and an upper limit at 42 MHz. As a result, the low bandpass filter 52 blocks the input signal to the cable modem 10 which originates at a signal source on the network from propagating to the upstream modulation circuit 20. The high bandpass filter 54, on the other hand, is selected to have a pass band having lower and upper limits which correspond to the lower and upper limits of the CATV frequency band. Accordingly, the high bandpass filter 54 passes the input signal to the cable modem 10 which originates on the network to the front end decoupler stage 34. Conversely, the frequency band for the input signal to the cable modem 10 which originates at the computer extends from 5 MHz to 42 MHz. As a result, the low bandpass filter 52 passes the input signal to the I/O port 13 while the high bandpass filter 54 blocks the input signal from propagating to the front end decoupler stage 34.

The front end decoupler stage 34 is comprised of an automatic gain control (or "AGC") circuit 56 having an input coupled to the output of the front end duplex filter stage 32 and an output coupled to an input of a broadband amplifier 58. In turn, the output of the broadband amplifier 58 is input the single conversion tuner stage 36. The input signal to the tuner 12 which is passed by the high bandpass filter 54 is fed to the AGC circuit 56 where, in response to an AGC level signal generated by the demodulator circuit 16, the input signal is sufficiently attenuated to avoid an overload within the single conversion tuner stage 36 when the input signal is later passed thereto.

In order for the broadband amplifier 58 to carry the input signal to the single conversion tuner stage 36, the broadband amplifier 58 must have a source impedance matching that of the cable 11. Otherwise, the input signal would be rejected by the broadband amplifier 58. Accordingly, the broadband amplifier 58 is a low gain, high power amplifier which matches the source impedance of the cable 11, typically 75 Ohms, and which includes pass bands centered at the frequency of each of the 110 channels within the 54 MHz to 860 MHz CATV frequency band for which a signal is carried. Thus, unlike conventional single conversion tuners, all channels within the frequency band are passed to the single conversion tuner stage 36. Broadband amplifiers such as the broadband amplifier 54 are unidirectional. Accordingly, the broadband amplifier 58 decouples the single conversion tuner stage 36 from the front end of the tuner 12 such that the channels passed to the single conversion turner stage 36 but later rejected thereby, as well as any return signals generated by the single conversion tuner stage 36 itself, are rejected by the broadband amplifier 58, thereby preventing these signals from passing back through the front end decoupler stage 38 and into the front end of the tuner 12.

The single conversion tuner stage 36 is comprised of first, second and third tuner circuits, each for a different frequency range. The first (or UHF) tuner circuit selects channels within the 469 MHz to 860 MHz frequency range and is comprised of a first adjustable bandpass filter 60-1, an AGC amplifier circuit 62-1, a second adjustable bandpass filter 64-1, a mixer 66-1 and a local oscillator (or "LO") 68-1. The second (or VHF high) tuner circuit selects channels within the 163 MHz to 468 MHz frequency range and is comprised of a first adjustable bandpass filter 60-2, an AGC amplifier circuit 62-2, a second adjustable bandpass filter 64-2, a mixer 68-2 and a local oscillator 68-2. Finally, the third (or VHF low) tuner circuit selects channels within the 54 MHz to 162 MHz frequency range and is comprised of a first adjustable filter 60-3, an AGC amplifier circuit 62-3, a second adjustable bandpass filter 64-3, a mixer 66-3 and a local oscillator 68-3.

Apart from the frequency of the channel selected thereby, each of the first, second and third tuner circuits operate identically. Accordingly, only one of the three tuner circuits need be described in greater detail. Thus, by way of example, the operation of the first tuner circuit shall now be described. As previously set forth, the input signal entering the single conversion tuner stage 36 includes all of the 110 channels contained within the CATV frequency range. The processor subsystem 22 selects a channel to be selected by the adjustable bandpass filter 60-1, typically of the varactor tuning type, for conversion to an IF signal and issues an appropriate instruction to phase locked loop (or "PLL") circuit 72 to lock to the frequency of the selected channel. In response, the PLL circuit 72 adjusts the bandpass for the adjustable bandpass filter 60-1 such that the selected channel passes to the AGC amplifier circuit 62-1 where the signal for the selected channel is amplified with sufficient gain to eliminate any contribution of noise from successive stages of the single conversion tuner. The signal is then passed on to the second adjustable bandpass filter 64-1, again, typically of the varactor tuning type, for a second filtering of the, now amplified, signal, again at the frequency of the selected channel.

From the second adjustable bandpass filter 64-1, the selected signal propagates to a mixer circuit 66-1 for conversion from an RF signal to an IF signal. Specifically, under control of the PLL circuit 72, the local oscillator 68-1 generates a signal having a frequency of the received signal plus the IF of 43.75 MHz. When transmitted to the mixer 66-1 together with the received signal, the frequency of the selected signal, the IF signal of 43.75 MHz, is generated. The IF signal is then passed by the mixer 66-1 to IF stage 70 where a differential amplifier converts the IF signal to a differential IF signal which is passed to the saw filter 14 and along the downstream path through the cable modem 10 in the manner previously described.

The strength of the 43.75 MHz signal generated by the local oscillator 68-1 is often of great concern as a possible source of a return signal which, when added to the selected signal, would pass back through the second adjustable bandpass filters 64-1, the AGC amplifier circuit 62-1 and the first adjustable bandpass filter 60-1 of the single conversion tuner stage 36 and the front end of the tuner 12 and onto the network where it could potentially interfere with the CATV signal being received by other tuners residing on the network. However, the broadband filter 58 sufficiently decouples any return signal generated by the local oscillator 68-1 which passes back through the single conversion tuner stage 36 to comply with the <−55 dBmV limitation on return signal specified by MCNS standards. Further, the isolation of the return path input and the IF output is at least 85 dB to ensure no cross-interference from the presence of an upstream signal. Finally, the pass band flatness within a 6 MHz band is, at most, 2.5 dB.

Thus, there has been described and illustrated herein, a cable modem which incorporates a tuner uniquely configured to include a single conversion tuner stage, thereby achieving considerable cost savings over those cable modems which require a double conversion tuner stage to meet MCNS standards. Use of a single conversion tuner stage within a tuner satisfying MCNS standards has been made possible by placement of a front end decoupler stage which isolates the front end of the tuner from the back end thereof such that return signals normally produced by the single conversion tuner stage, as well as RF signals passed by the front end decoupler stage but rejected by the single conversion tuner stage, are blocked from passing back through the front end of the tuner and onto the cable where they could interfere with the CATV signal being received by other tuners residing on the network.

Although an illustrative embodiment of the invention has been shown and described, other modifications, changes, and substitutions are intended in the foregoing disclosure. Accordingly, it is appropriate that the appended claims be construed broadly and in a manner consistent with the scope of the invention.

What is claimed is:

1. A tuner for a cable modem, comprising:
    a front end decoupler stage having an input and an output; and
    a single conversion tuner having an input coupled to said output of said front end decoupler stage and an output;
    said front end decoupler stage receiving a plurality of RF signals at said input thereof and passing each one of said plurality of received RF signals to said input of said single conversion tuner;
    said single conversion tuner receiving said plurality of RF signals, selecting one of said plurality of RF signals for conversion into an IF signal and transmission from said output and rejecting the remainder of said plurality of RF signals;
    said front end decoupler stage being comprised of unidirectional circuitry which isolates said single conversion tuner from said input of said front end decoupler stage by passing each one of said plurality of received RF signals while preventing said rejected ones of said plurality of RF signals and return signals generated by said single conversion tuner during conversion of said selected one of said plurality of RF signals into said IF signal from passing back through said front end decoupler stage.

2. A tuner according to claim 1 wherein a cable is coupled to said input of said front end decoupler stage and wherein said front end decoupler stage rejects said rejected ones of said plurality of RF signals and return signals, generated by said single conversion tuner, from being transmitted to devices coupled to said cable.

3. A tuner according to claim 2 wherein said plurality of RF signals are in a band which extends from about 54 MHz to about 860 MHz.

4. A tuner according to claim 1 and further comprising:
    a front end duplex filter stage for coupling to a network, a computer system and said front end decoupler stage, said front end duplex filter stage directing signals received from said network to said front end decoupler stage and directing signals received from said computer system to said network.

5. A tuner according to claim 1 and further comprising:
    an input/output ("I/O") port for coupling to a CATV cable;
    an input port for coupling to a computer system;
    a downstream signal path coupling said I/O port and said input of said front end decoupler stage; and
    an upstream signal path coupling said I/O port and said input port;
    said downstream signal path used to pass said plurality of RF signals to said front end decoupler stage;
    said upstream signal path used to pass signals, generated by said computer system, to said CATV cable.

6. A tuner according to claim 5 and further comprising:
    a node which joins said upstream path to said downstream path;
    said node located between said I/O port and said input of said front end decoupler stage;
    a first filter positioned along said downstream path between said node and said input of said front end decoupler stage; and
    a second filter positioned along said upstream path between said node and said input port;
    said first filter preventing signals, generated by said computer system, from passing to said front end decoupler stage;
    said second filter preventing RF signals, received from said CATV cable, from passing to said input port.

7. A tuner according to claim 6 wherein said first filter is a high pass filter having a pass band which extends from about 54 MHz to about 860 MHz.

8. A tuner according to claim 7 wherein said second filter is a low pass filter having a pass band which extends from about 5 MHz to about 42 MHz.

9. A tuner according to claim 1 wherein said front end decoupler stage further comprises a broadband filter, said broadband filter passing said plurality of RF signals, each at a discrete frequency within a frequency range.

10. A tuner according to claim 1 wherein said front end decoupler stage further comprises:
    an automatic gain control ("AGC") circuit having an input coupled to said input of said front end decoupler stage and an output; and
    a broadband amplifier having an input coupled to said output of said AGC circuit and an output coupled to said output of said front end decoupler stage.

11. A cable modem suitable for coupling to a CATV cable, said cable modem comprising:
    an input/output ("I/O") port;
    a downstream signal path coupling said I/O port and a computer;
    an upstream signal path coupling said I/O port and said computer;
    a node which joins said upstream path to said downstream path;
    a single conversion tuner stage positioned along said downstream path and coupled between said I/O port and said computer; and
    a decoupler stage positioned along said downstream path and coupled between said I/O port and said single conversion tuner;
    said single conversion tuner stage;
    said decoupler stage receiving a plurality of RF signals from said CATV cable and passing each one of said plurality of received RF signals to said single conversion tuner stage;
    said single conversion tuner converting a selected one of said plurality of RF signals into an IF signal and rejecting the remainder of said plurality of RF signals;
    said decoupler stage being comprised of unidirectional circuitry which isolates said single conversion tuner from said input of said decoupler stage by passing each one of said plurality of received RF signals while preventing said rejected ones of said plurality of RF signals and return signals generated by said single conversion tuner stage during conversion of said selected one of said plurality of RF signals into said IF signal from passing back through said decoupler stage.

12. A cable modem according to claim 11 wherein said downstream signal path further comprises a demodulator coupled to receive said IF signal from said single conversion tuner, said demodulator performing an analog-to-digital conversion of said IF signal.

13. A cable modem according to claim 12 wherein said downstream signal path further comprises a media access controller coupled to receive said digital conversion of said IF signal from said demodulator, said media access controller adjusting said digital conversion of said IF signal for placement on a peripheral connection interface of said computer.

14. A cable modem according to claim 13 wherein said upstream signal path further comprises a modulator circuit placed between said media access controller and said node, said modulator performing a digital-to-analog conversion of digital signals generated by said computer.

15. A cable modem according to claim 11 wherein said decoupler stage further comprises a uni-directional broadband filter which passes said plurality of RF signals, each at a discrete frequency within a frequency band which extends from about 54 MHz to about 860 MHz.

16. A cable modem according to claim 15 wherein said uni-directional broadband filter has a plurality of passbands, each one of said passbands centered at said discrete frequency of a corresponding one of said plurality of RF signals.

17. A tuner for a cable modem, comprising:
   a front end decoupler stage having an input and an output; and
   a single conversion tuner having an input coupled to said output of said front end decoupler stage and an output;
   said front end decoupler stage passing a plurality of RF signals, received at said input thereof, to said input of said single conversion tuner;
   said single conversion tuner receiving said plurality of RF signals, selecting one of said plurality of RF signals for conversion into an IF signal and transmission from said output and rejecting the remainder of said plurality of RF signals;
   said front end decoupler stage isolating said single conversion tuner from said input of said front end decoupler stage by passing said plurality of RF signals while rejecting while preventing said rejected ones of said plurality of RF signals and return signals generated by said single conversion tuner during conversion of said selected one of said plurality of RF signals into said IF signal from passing back through said front end decoupler stage;
   said front end decoupler stage further comprising a unidirectional broadband filter having a passband centered at the frequency of each one of a plurality of channels within a frequency band which extends from about 54 MHz to about 860 MHz.

18. A tuner according to claim 17 and further comprising:
   a front end duplex filter stage for coupling to a network, a computer system and said front end decoupler stage, said front end duplex filter stage directing signals received from said network to said front end decoupler stage and directing signals received from said computer system to said network.

19. A tuner according to claim 17 and further comprising:
   an input/output ("I/O") port for coupling to a CATV cable;
   an input port for coupling to a computer system;
   a downstream signal path coupling said I/O port and said input of said front end decoupler stage; and
   an upstream signal path coupling said I/O port and said input port;
   said downstream signal path used to pass said plurality of RF signals to said front end decoupler stage;
   said upstream signal path used to pass signals, generated by said computer system, to said CATV cable.

20. A tuner, comprising:
   a front end decoupler stage having an input and an output; and
   a single conversion tuner having an input coupled to said output of said front end decoupler stage and an output;
   said front end decoupler stage receiving a plurality of RF signals at said input thereof and passing each one of said plurality of received RF signals to said input of said single conversion tuner;
   said single conversion tuner receiving said plurality of RF signals, selecting one of said plurality of RF signals for conversion into an IF signal and transmission from said output and rejecting the remainder of said plurality of RF signals;
   said front end decoupler stage being comprised of unidirectional circuitry which isolates said single conversion tuner from said input of said front end decoupler stage by passing each one of said plurality of received RF signals while preventing said rejected ones of said plurality of RF signals and return signals generated by said single conversion tuner during conversion of said selected one of said plurality of RF signals into said IF signal from passing back through said front end decoupler stage.

21. A tuner according to claim 20 wherein a cable is coupled to said input of said front end decoupler stage and wherein said front end decoupler stage rejects said rejected ones of said plurality of RF signals and return signals, generated by said single conversion tuner, from being transmitted to devices coupled to said cable.

22. A tuner according to claim 20 wherein said plurality of RF signals are in a band which extends from about 54 MHz to about 860 MHz.

23. A tuner according to claim 20 wherein said front end decoupler stage further comprises a broadband filter, said broadband filter passing said plurality of RF signals, each at a discrete frequency within a frequency range.

24. A tuner according to claim 20 wherein said front end decoupler stage further comprises a unidirectional broadband filter having a plurality of passbands, each one of said plurality of passbands centered at a discrete frequency of a corresponding one of said RF signals, said plurality of passbands being within a frequency band which extends from about 54 MHz to about 860 MHz.

* * * * *